(12) United States Patent
Dell et al.

(10) Patent No.: US 7,331,010 B2
(45) Date of Patent: Feb. 12, 2008

(54) SYSTEM, METHOD AND STORAGE MEDIUM FOR PROVIDING FAULT DETECTION AND CORRECTION IN A MEMORY SUBSYSTEM

(75) Inventors: Timothy J. Dell, Colchester, VT (US); Kevin C. Gower, LaGrangeville, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 516 days.

(21) Appl. No.: 10/977,914

(22) Filed: Oct. 29, 2004

(65) Prior Publication Data
US 2006/0107175 A1  May 18, 2006

(51) Int. Cl.
*G11C 29/52* (2006.01)
(52) U.S. Cl. ............... 714/767; 714/773; 714/776
(58) Field of Classification Search ........... 714/767, 714/773, 776; *G11C 29/52*
See application file for complete search history.

(56) References Cited

U.S. PATENT DOCUMENTS

| | | | |
|---|---|---|---|
| 3,825,904 A | 7/1974 | Burk et al. | |
| 4,028,675 A | 6/1977 | Frankenburg | 711/106 |
| 4,135,240 A | 1/1979 | Ritchie | |
| 4,475,194 A | 10/1984 | LaVallee et al. | 371/10 |
| 4,486,739 A | 12/1984 | Franaszek et al. | 340/347 DD |
| 4,654,857 A | 3/1987 | Samson et al. | |
| 4,723,120 A | 2/1988 | Petty, Jr. | 340/825.02 |
| 4,740,916 A | 4/1988 | Martin | 364/900 |
| 4,796,231 A | 1/1989 | Pinkham | 385/189.05 |
| 4,803,485 A | 2/1989 | Rypinski | 370/452 |
| 4,833,605 A | 5/1989 | Terada et al. | 364/200 |
| 4,943,984 A | 7/1990 | Pechanek et al. | 375/109 |
| 4,985,828 A | 1/1991 | Shimizu et al. | |
| 5,053,947 A | 10/1991 | Heibel et al. | 364/200 |
| 5,177,375 A | 1/1993 | Ogawa et al. | |

(Continued)

FOREIGN PATENT DOCUMENTS

GB     2396711 A     6/2004

(Continued)

OTHER PUBLICATIONS

Brown, et al "Complier-Based I/O Prefetching for Out-of-Core Applications", ACM Transactions on Computer Systems, vol. 19, No. 2, May 2001, pp. 111-170.

(Continued)

*Primary Examiner*—R. Stephen Dildine
(74) *Attorney, Agent, or Firm*—Cantor Colburn LLP; Lynn Augspurger

(57) ABSTRACT

A memory subsystem with a memory bus and a memory assembly. The memory bus includes multiple bitlanes. The memory assembly is in communication with the memory bus and includes instructions for receiving an error code correction (ECC) word in multiple packets via the memory bus. The ECC word includes data bits and ECC bits arranged into multiple multi-bit ECC symbols. Each of the ECC symbols is associated with one of the bitlanes on the memory bus. The memory assembly also includes instructions for utilizing one of the ECC symbols to perform error detection and correction for the bits in the ECC word received via the bitlane associated with the ECC symbol.

14 Claims, 16 Drawing Sheets

U.S. PATENT DOCUMENTS

| | | | |
|---|---|---|---|
| 5,206,946 A | 4/1993 | Brunk | 710/2 |
| 5,214,747 A | 5/1993 | Cok | 395/27 |
| 5,265,049 A | 11/1993 | Takasugi | |
| 5,265,212 A | 11/1993 | Bruce, II | 710/113 |
| 5,287,531 A | 2/1994 | Rogers, Jr. et al. | 395/800 |
| 5,347,270 A | 9/1994 | Matsuda et al. | 340/2.21 |
| 5,387,911 A | 2/1995 | Gleichert et al. | 341/95 |
| 5,454,091 A | 9/1995 | Sites et al. | |
| 5,475,690 A | 12/1995 | Burns et al. | 370/105.3 |
| 5,513,135 A | 4/1996 | Dell et al. | 365/52 |
| 5,531,135 A | 7/1996 | Dolla | 365/52 |
| 5,544,309 A | 8/1996 | Chang et al. | |
| 5,592,632 A | 1/1997 | Leung et al. | 395/306 |
| 5,611,055 A | 3/1997 | Krishan et al. | 395/281 |
| 5,613,077 A | 3/1997 | Leung et al. | 395/306 |
| 5,629,685 A | 5/1997 | Allen et al. | 340/825.02 |
| 5,661,677 A | 8/1997 | Rondeau, II et al. | |
| 5,666,480 A | 9/1997 | Leung et al. | 395/180 |
| 5,822,749 A | 10/1998 | Agarwal | |
| 5,872,996 A | 2/1999 | Barth et al. | 395/853 |
| 5,926,838 A | 7/1999 | Jeddeloh | 711/167 |
| 5,928,343 A | 7/1999 | Farmwald et al. | 710/104 |
| 5,995,405 A | 11/1999 | Trick | 365/63 |
| 6,049,476 A | 4/2000 | Laudon et al. | 365/52 |
| 6,076,158 A | 6/2000 | Sites et al. | |
| 6,096,091 A | 8/2000 | Hartmann | 716/17 |
| 6,128,746 A | 10/2000 | Clark et al. | 713/324 |
| 6,170,047 B1 | 1/2001 | Dye | |
| 6,170,059 B1 | 1/2001 | Pruett et al. | |
| 6,292,903 B1 | 9/2001 | Coteus et al. | 713/401 |
| 6,317,352 B1 | 11/2001 | Halbert et al. | 365/52 |
| 6,321,343 B1 | 11/2001 | Toda | 713/600 |
| 6,338,113 B1 | 1/2002 | Kubo et al. | 711/105 |
| 6,370,631 B1 | 4/2002 | Dye | |
| 6,378,018 B1 | 4/2002 | Tsern et al. | 710/129 |
| 6,393,528 B1 | 5/2002 | Arimilli et al. | |
| 6,473,836 B1 | 10/2002 | Ikeda | |
| 6,477,614 B1 | 11/2002 | Leddige et al. | |
| 6,483,755 B2 | 11/2002 | Leung et al. | 365/189.05 |
| 6,484,271 B1 | 11/2002 | Gray | |
| 6,493,250 B2 | 12/2002 | Halbert et al. | 365/63 |
| 6,496,540 B1 | 12/2002 | Windmer | 375/242 |
| 6,496,910 B1 | 12/2002 | Baentsch et al. | |
| 6,499,070 B1 | 12/2002 | Whetsel | |
| 6,502,161 B1 | 12/2002 | Perego et al. | 711/5 |
| 6,507,888 B2 | 1/2003 | Wu et al. | 711/105 |
| 6,510,100 B2 | 1/2003 | Grundon et al. | 365/233 |
| 6,513,091 B1 | 1/2003 | Blackmon et al. | 710/316 |
| 6,526,469 B1 | 2/2003 | Drehmel et al. | 710/306 |
| 6,532,525 B1 | 3/2003 | Aleksic et al. | 711/168 |
| 6,549,971 B1 | 4/2003 | Cecchi et al. | 710/306 |
| 6,553,450 B1 | 4/2003 | Dodd et al. | 711/105 |
| 6,557,069 B1 | 4/2003 | Drehmel et al. | 710/307 |
| 6,564,329 B1 | 5/2003 | Cheung et al. | |
| 6,587,912 B2 | 7/2003 | Leddige | |
| 6,601,121 B2 | 7/2003 | Singh et al. | 710/112 |
| 6,611,905 B1 | 8/2003 | Grundon et al. | 711/167 |
| 6,622,217 B2 | 9/2003 | Gharachorloo et al. | 711/141 |
| 6,625,687 B1 | 9/2003 | Halbert et al. | 711/105 |
| 6,625,702 B2 | 9/2003 | Rentschler et al. | |
| 6,631,439 B2 | 10/2003 | Saulsbury et al. | |
| 6,678,811 B2 | 1/2004 | Rentschler et al. | 711/167 |
| 6,697,919 B2 | 2/2004 | Gharachorloo et al. | 711/141 |
| 6,704,842 B1 | 3/2004 | Janakiraman et al. | |
| 6,721,944 B2 | 4/2004 | Chaudhry et al. | |
| 6,738,836 B1 | 5/2004 | Kessler et al. | |
| 6,741,096 B2 | 5/2004 | Moss | |
| 6,766,389 B2 | 7/2004 | Hayter et al. | |
| 6,775,747 B2 | 8/2004 | Venkatraman | |
| 6,791,555 B1 | 9/2004 | Radke et al. | |
| 6,839,393 B1 | 1/2005 | Sidiropoulos | 375/371 |
| 6,877,076 B1 | 4/2005 | Cho et al. | |
| 6,877,078 B2 | 4/2005 | Fujiwara et al. | |
| 6,889,284 B1 | 5/2005 | Nizar et al. | |
| 6,977,536 B2 | 12/2005 | Chin-Chich et al. | 327/116 |
| 7,133,972 B2 | 11/2006 | Jeddeloh | |
| 7,177,211 B2 | 2/2007 | Zimmerman | |
| 7,206,962 B2* | 4/2007 | Deegan et al. | 714/767 |
| 2001/0000822 A1 | 5/2001 | Dell et al. | 711/170 |
| 2001/0003839 A1 | 6/2001 | Kondo | |
| 2002/0019926 A1 | 2/2002 | Huppenthal et al. | 712/15 |
| 2002/0038405 A1 | 3/2002 | Leddige et al. | |
| 2002/0083255 A1 | 6/2002 | Greeff et al. | 710/305 |
| 2002/0103988 A1 | 8/2002 | Dornier | |
| 2002/0112119 A1 | 8/2002 | Halbert et al. | |
| 2002/0112194 A1 | 8/2002 | Uzelac | 713/500 |
| 2002/0124195 A1 | 9/2002 | Nizar | |
| 2002/0147898 A1 | 10/2002 | Rentschler et al. | |
| 2002/0174274 A1 | 11/2002 | Wu et al. | |
| 2003/0033364 A1 | 2/2003 | Garnett et al. | 709/203 |
| 2003/0056183 A1 | 3/2003 | Kobayahi | |
| 2003/0084309 A1 | 5/2003 | Kohn | 713/189 |
| 2003/0090879 A1 | 5/2003 | Doblar et al. | 361/728 |
| 2003/0126363 A1 | 7/2003 | David | |
| 2003/0223303 A1 | 12/2003 | Lamb et al. | 365/230.06 |
| 2003/0236959 A1 | 12/2003 | Johnson et al. | 711/167 |
| 2004/0006674 A1 | 1/2004 | Hargis et al. | 711/156 |
| 2004/0049723 A1 | 3/2004 | Obara | 714/729 |
| 2004/0098549 A1 | 5/2004 | Dorst | |
| 2004/0117588 A1 | 6/2004 | Arimilli et al. | |
| 2004/0128474 A1 | 7/2004 | Vorbach | 712/10 |
| 2004/0163028 A1* | 8/2004 | Olarig | 714/767 |
| 2004/0205433 A1 | 10/2004 | Gower et al. | |
| 2004/0230718 A1 | 11/2004 | Polzin et al. | |
| 2004/0246767 A1 | 12/2004 | Vogt | 365/154 |
| 2004/0250153 A1 | 12/2004 | Vogt | 713/500 |
| 2004/0260909 A1 | 12/2004 | Lee et al. | |
| 2004/0260957 A1 | 12/2004 | Jeddeloh et al. | |
| 2005/0050237 A1 | 3/2005 | Jeddeloh | |
| 2005/0050255 A1 | 3/2005 | Jeddeloh | |
| 2005/0066136 A1 | 3/2005 | Schnepper | |
| 2005/0080581 A1 | 4/2005 | Zimmerman et al. | |
| 2005/0120157 A1 | 6/2005 | Chen et al. | 710/313 |
| 2005/0125702 A1 | 6/2005 | Huang et al. | |
| 2005/0125703 A1 | 6/2005 | Lefurgy et al. | |
| 2005/0138267 A1 | 6/2005 | Bains et al. | |
| 2005/0144399 A1 | 6/2005 | Hosomi | |
| 2005/0166006 A1 | 7/2005 | Talbot et al. | |
| 2005/0177690 A1 | 8/2005 | LaBerge | |
| 2005/0229132 A1 | 10/2005 | Butt et al. | 716/10 |
| 2005/0257005 A1 | 11/2005 | Jeddeloh | |
| 2005/0259496 A1 | 11/2005 | Hsu et al. | |
| 2006/0036826 A1* | 2/2006 | Dell et al. | 711/167 |
| 2006/0036827 A1* | 2/2006 | Dell et al. | 711/167 |
| 2006/0107175 A1 | 5/2006 | Dell et al. | |

FOREIGN PATENT DOCUMENTS

| | | |
|---|---|---|
| JP | 04326140 A | 11/1992 |

OTHER PUBLICATIONS

Wang, et al "Guided Region Prefetching: A Cooperative Hardware/Software Approach", pp. 388-398.

Natarajan, et al "A Study of Performance Impact of Memory Controller Features in Multi-Processor Server Environment", pp. 80-87.

Nilsen, "High-Level Dynamic Memory Management for Object-Oriented Real-Time Systems", pp. 86-93.

Understanding System Memory and CPU Speeds: A Layman's Guide to the Front Side Bus (FSB), [online]; [retrieved on Feb. 23, 2006]; retrieved from the Internet http://www.direction.com/fsbguide.html.

JEDEC Solid State Technology Association, "JEDEC Standard: DDR2 SDRAM Specification", Jan. 2004, JEDEC, Revision JESD79-2A, p. 10.

Sivenerona et al.; "RedCAN™: Simulations of two Fault Recovery Algorithms for CAN;" Proceedings for the 10th IEEE Pacifio Rims International Symposium on Dependable Computing (PRDC204); 2005.

Benini, Luca, et al. "System-Level Power Optimization: Techniques and Tools", ACM Transactions on Design Automation of Electronic Systems, vol. 6, No. 2, Apr. 2001, pp. 149-206.

Boudon, et al., "Novel Bus Reconfiguration Scheme With Spare Lines", IBM Technical Disclosure Bulletin, May 1987, vol. 29, No. 12, pp. 1-3.

Massoud Pedram, "Power Minimization in IC Design Principles and Applications", ACM Transactions on Design Automation of Electronic Systems vol. 1, No. 1, Jan. 1996, pp. 3-56.

P.R. Panda, "Data and Memory Optimization Techniques For Embedded Systems", ACM Transactions on Design Automation of Electronic Systems, vol. 6, No. 2, Apr. 2001, pp. 149-206.

Penrod, Lee, "Understanding System Memory and CPU Speeds: A laymans guide to the Front Side Bus (FSB)", Dec. 28, 2005, Direction . Org, pp. 1-5, http://www.directron.com/directron/fsbguide.html.

Singh, S., et al., "Bus Sparing for Fault-Tolerant System Design", IBM Technical Disclosure Bulletin, Dec. 1991, vol. 34, No. 71, pp. 117-118.

IEEE, "IEEE Standard Test Access Port and Boundary-Scan Architecture", Jul. 23, 2001, IEEE Std 1149-2001, pp. 11-13.

Rosenberg, "Dictionary of Computers, Information Processing & Telecommuications", Second Edition, John Wiley & Sons, Inc. 1987. 3 pgs.

* cited by examiner

| Downstream Format : 9 data – 8 cmd – 4 ecc – 1 spare – 1 diff clk = 24 TOTAL WIRES | | | | | | | | | | | | | | | | | | | | | | |
|---|---|---|---|---|---|---|---|---|---|---|---|---|---|---|---|---|---|---|---|---|---|---|
| s3_us(#)<br>d3_s3(#) | 0 | 1 | 2 | 3 | 4 | 5 | 6 | 7 | 8 | 9 | 10 | 11 | 12 | 13 | 14 | 15 | 16 | 17 | 18 | 19 | 20 | 21 |
| Xfer/Bit | spare | ecc0 | ecc1 | ecc2 | ecc3 | di0 | di1 | di2 | di3 | di4 | di5 | di6 | di7 | di8 | c0 | c1 | c2 | c3 | c4 | c5 | c6 | c7 |
| 0 | S0 | E00 | E10 | E20 | E30 | D00 | D10 | D20 | D30 | D40 | D50 | D60 | D70 | D80 | C00 | C10 | C20 | C30 | C40 | C50 | C60 | C70 |
| 1 | S1 | E01 | E11 | E21 | E31 | D01 | D11 | D21 | D31 | D41 | D51 | D61 | D71 | D81 | C01 | C11 | C21 | C31 | C41 | C51 | C61 | C71 |
| 2 | S2 | E02 | E12 | E22 | E32 | D02 | D12 | D22 | D32 | D42 | D52 | D62 | D72 | D82 | C02 | C12 | C22 | C32 | C42 | C52 | C62 | C72 |
| 3 | S3 | E03 | E13 | E23 | E33 | D03 | D13 | D23 | D33 | D43 | D53 | D63 | D73 | D83 | C03 | C13 | C23 | C33 | C43 | C53 | C63 | C73 |
| 4 | S4 | E04 | E14 | E24 | E34 | D04 | D14 | D24 | D34 | D44 | D54 | D64 | D74 | D84 | C04 | C14 | C24 | C34 | C44 | C54 | C64 | C74 |
| 5 | S5 | E05 | E15 | E25 | E35 | D05 | D15 | D25 | D35 | D45 | D55 | D65 | D75 | D85 | C05 | C15 | C25 | C35 | C45 | C55 | C65 | C75 |
| 6 | S6 | E06 | E16 | E26 | E36 | D06 | D16 | D26 | D36 | D46 | D56 | D66 | D76 | D86 | C06 | C16 | C26 | C36 | C46 | C56 | C66 | C66 |
| 7 | S7 | E07 | E17 | E27 | E37 | D07 | D17 | D27 | D37 | D47 | D57 | D67 | D77 | D87 | C07 | C17 | C27 | C37 | C47 | C57 | C67 | C67 |

S : Spare bits
1302

E : ECC check bits
1304

D : Write data bits
1306

C : Command bits
1308

Upstream Format : 18 data + 4 ecc + 1 spare + 1 diff clk = 25 TOTAL WIRES

| s3_us(#) d3_s3(#) | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|---|
| Xfer/Bit | spare | ecc0 | ecc1 | ecc2 | ecc3 | do0 | do1 | do2 | do3 | do4 | do5 | do6 | do7 | do8 | do9 | do10 | do11 | do12 | do13 | do14 | do15 | do16 | do17 |
| 0 | S0 | E00 | E10 | E20 | E30 | D00 | D10 | D20 | D30 | D40 | D50 | D60 | D70 | D80 | D90 | D100 | D110 | D120 | D130 | D140 | D150 | D160 | D170 |
| 1 | S1 | E01 | E11 | E21 | E31 | D01 | D11 | D21 | D31 | D41 | D51 | D61 | D71 | D81 | D91 | D101 | D111 | D121 | D131 | D141 | D151 | D161 | D171 |
| 2 | S2 | E02 | E12 | E22 | E32 | D02 | D12 | D22 | D32 | D42 | D52 | D62 | D72 | D82 | D92 | D102 | D112 | D122 | D132 | D142 | D152 | D162 | D172 |
| 3 | S3 | E03 | E13 | E23 | E33 | D03 | D13 | D23 | D33 | D43 | D53 | D63 | D73 | D83 | D93 | D103 | D113 | D123 | D133 | D143 | D153 | D163 | D173 |
| 4 | S4 | E04 | E14 | E24 | E34 | D04 | D14 | D24 | D34 | D44 | D54 | D64 | D74 | D84 | D94 | D104 | D114 | D124 | D134 | D144 | D154 | D164 | D174 |
| 5 | S5 | E05 | E15 | E25 | E35 | D05 | D15 | D25 | D35 | D45 | D55 | D65 | D75 | D85 | D95 | D105 | D115 | D125 | D135 | D145 | D155 | D165 | D175 |
| 6 | S6 | E06 | E16 | E26 | E36 | D06 | D16 | D26 | D36 | D46 | D56 | D66 | D76 | D86 | D96 | D106 | D116 | D126 | D136 | D146 | D156 | D166 | D176 |
| 7 | S7 | E07 | E17 | E27 | E37 | D07 | D17 | D27 | D37 | D47 | D57 | D67 | D77 | D87 | D97 | D107 | D117 | D127 | D137 | D147 | D157 | D167 | D177 |

S : Spare bits 1402
E : ECC check bits 1404
D : Read data bits 1406

| SYMBOL | BIT 1 | BIT 2 | BIT 3 | BIT 4 |
|---|---|---|---|---|
| 1 | D00 | D10 | D20 | D30 |
| 2 | D40 | D50 | D60 | D70 |
| 3 | D80 | D90 | D100 | D110 |
| 4 | D120 | D130 | D140 | D150 |
| 5 | D160 | D170 | E00 | E10 |
| 6 | E20 | E30 | D01 | D11 |
| 7 | D21 | D31 | D41 | D51 |
| 8 | D61 | D71 | D81 | D91 |
| 9 | D101 | D111 | D121 | D131 |
| 10 | D141 | D151 | D161 | D171 |
| 11 | E01 | E11 | E21 | E31 |
| 12 | D02 | D12 | D22 | D32 |
| 13 | D42 | D52 | D62 | D72 |
| 14 | D82 | D92 | D102 | D112 |
| . | . | . | . | . |
| . | . | . | . | . |
| . | . | . | . | . |
| 22 | E03 | E13 | E23 | E33 |

1506 spans BIT 1–BIT 4. 1504 spans SYMBOL column. Rows 1–5 (through D150) marked "transfer 0"; rows 6–11 marked "transfer 1".

FIG. 15

|  | 1604 | | | | 1606 |
|---|---|---|---|---|---|
| SYMBOL | BIT 1 | BIT 2 | BIT 3 | BIT 4 | BIT LANE |
| 1 | D00 | D01 | D02 | D03 | 5 |
| 2 | D10 | D11 | D12 | D13 | 6 |
| 3 | D20 | D21 | D22 | D23 | 7 |
| 4 | D30 | D31 | D32 | D33 | 8 |
| 5 | D40 | D41 | D42 | D43 | 9 |
| 6 | D50 | D51 | D52 | D53 | 10 |
| 7 | D60 | D61 | D62 | D63 | 11 |
| 8 | D70 | D71 | D72 | D73 | 12 |
| ... | ... | ... | ... | ... | ... |
| 18 | D170 | D171 | D172 | D173 | 22 |
| 19 | E00 | E01 | E02 | E03 | 1 |
| 20 | E10 | E11 | E12 | E13 | 2 |
| 21 | E20 | E21 | E22 | E23 | 3 |
| 22 | E30 | E31 | E32 | E33 | 4 |
|  | transfer 0 | transfer 1 | transfer 2 | transfer 3 | |

1603 brackets symbols 1–22.

FIG. 16

SYSTEM, METHOD AND STORAGE MEDIUM FOR PROVIDING FAULT DETECTION AND CORRECTION IN A MEMORY SUBSYSTEM

BACKGROUND OF THE INVENTION

The invention relates to a memory subsystem and in particular, to providing fault detection and correction in a memory subsystem.

Computer memory subsystems have evolved over the years, but continue to retain many consistent attributes. Computer memory subsystems from the early 1980's, such as the one disclosed in U.S. Pat. No. 4,475,194 to LaVallee et al., of common assignment herewith, included a memory controller, a memory assembly (contemporarily called a basic storage module (BSM) by the inventors) with array devices, buffers, terminators and ancillary timing and control functions, as well as several point-to-point busses to permit each memory assembly to communicate with the memory controller via its own point-to-point address and data bus. FIG. 1 depicts an example of this early 1980 computer memory subsystem with two BSMs, a memory controller, a maintenance console, and point-to-point address and data busses connecting the BSMs and the memory controller.

FIG. 2, from U.S. Pat. No. 5,513,135 to Dell et al., of common assignment herewith, depicts an early synchronous memory module, which includes synchronous dynamic random access memories (DRAMs) 8, buffer devices 12, an optimized pinout, an interconnect and a capacitive decoupling method to facilitate operation. The patent also describes the use of clock re-drive on the module, using such devices as phase lock loops (PLLs).

FIG. 3, from U.S. Pat. No. 6,510,100 to Grundon et al., of common assignment herewith, depicts a simplified diagram and description of a memory system 10 that includes up to four registered dual inline memory modules (DIMMs) 40 on a traditional multi-drop stub bus channel. The subsystem includes a memory controller 20, an external clock buffer 30, registered DIMMs 40, an address bus 50, a control bus 60 and a data bus 70 with terminators 95 on the address bus 50 and data bus 70.

FIG. 4 depicts a 1990's memory subsystem which evolved from the structure in FIG. 1 and includes a memory controller 402, one or more high speed point-to-point channels 404, each connected to a bus-to-bus converter chip 406, and each having a synchronous memory interface 408 that enables connection to one or more registered DIMMs 410. In this implementation, the high speed, point-to-point channel 404 operated at twice the DRAM data rate, allowing the bus-to-bus converter chip 406 to operate one or two registered DIMM memory channels at the full DRAM data rate. Each registered DIMM included a PLL, registers, DRAMs, an electrically erasable programmable read-only memory (EEPROM) and terminators, in addition to other passive components.

As shown in FIG. 5, memory subsystems were often constructed with a memory controller connected either to a single memory module, or to two or more memory modules interconnected on a 'stub' bus. FIG. 5 is a simplified example of a multi-drop stub bus memory structure, similar to the one shown in FIG. 3. This structure offers a reasonable tradeoff between cost, performance, reliability and upgrade capability, but has inherent limits on the number of modules that may be attached to the stub bus. The limit on the number of modules that may be attached to the stub bus is directly related to the data rate of the information transferred over the bus. As data rates increase, the number and length of the stubs must be reduced to ensure robust memory operation. Increasing the speed of the bus generally results in a reduction in modules on the bus with the optimal electrical interface being one in which a single module is directly connected to a single controller, or a point-to-point interface with few, if any, stubs that will result in reflections and impedance discontinuities. As most memory modules are sixty-four or seventy-two bits in data width, this structure also requires a large number of pins to transfer address, command, and data. One hundred and twenty pins are identified in FIG. 5 as being a representative pincount.

FIG. 6, from U.S. Pat. No. 4,723,120 to Petty, of common assignment herewith, is related to the application of a daisy chain structure in a multipoint communication structure that would otherwise require multiple ports, each connected via point-to-point interfaces to separate devices. By adopting a daisy chain structure, the controlling station can be produced with fewer ports (or channels), and each device on the channel can utilize standard upstream and downstream protocols, independent of their location in the daisy chain structure.

FIG. 7 represents a daisy chained memory bus, implemented consistent with the teachings in U.S. Pat. No. 4,723,120. A memory controller 111 is connected to a memory bus 315, which further connects to a module 310a. The information on memory bus 315 is re-driven by the buffer on module 310a to a next module, 310b, which further re-drives the memory bus 315 to module positions denoted as 310n. Each module 310a includes a DRAM 311a and a buffer 320a. The memory bus 315 may be described as having a daisy chain structure with each bus being point-to-point in nature.

A variety of factors including faulty components and inadequate design tolerances may result in errors in the data being processed by a memory subsystem. Errors may also occur during data transmission due to "noise" in the communication channel (e.g., the bus 315). As a result of these errors, one or more bits, which may be represented as X, which are to be transmitted within the system, are corrupted so as to be received as "/X" (i.e., the logical complement of the value of X). In order to protect against such errors, the data bits may be coded via an error correcting code (ECC) in such a way that the errors may be detected and possibly corrected by special ECC logic circuits. A typical ECC implementation appends a number of check bits to each data word. The appended check bits are used by the ECC logic circuits to detect errors within the data word. By appending bits (e.g., parity bits) to the data word, each bit corresponding to a subset of data bits within the data word, the parity concepts may be expanded to provide the detection of multiple bit errors or to determine the location of single or multiple bit errors. Once a data bit error is located, a logic circuit may be utilized to correct the located erroneous bit, thereby providing single error correction (SEC). Many SEC codes have the ability to detect double errors and are thus termed SEC double error detecting (SEC-DED) codes.

FIG. 8 represents a typical parallel bus ECC structure that transfers a complete ECC word in a single cycle. The structure depicted in FIG. 8 is consistent with the teachings in U.S. Pat. No. 6,044,483 to Chen et al., of common assignment herewith. FIG. 8 depicts an 88/72 ECC for computer systems having an eight bit per chip memory configuration. The lines labeled "Wire 0" through "Wire 72" each represent a wire on the memory bus 315 with seventy-two wires. For a memory subsystem with an eight bit per chip memory configuration, sixty-four bits of data and eight ECC bits are transferred every cycle. The ECC word is transferred entirely in one cycle, and a SEC-DED code may be utilized to correct any single bit failure anywhere in the ECC word, including a hard wire or bitlane failure. In the case of a hard wire or bitlane failure, every transfer has the same bitlane in error with the ECC correcting it for each transfer.

FIG. 9 depicts a typical manner of defining symbol ECCs for use in fault detection and correction in a memory subsystem. FIG. 8 is consistent with the teachings of U.S. Pat. No. 6,044,483. As shown in FIG. 9, the symbols are four bits in length and the symbols are defined across bitlanes. As is known in the art, a symbol refers to a mathematical derivation of ECC and corresponds to a group of bits that the ECC is able to correct either individually or as a group. Referring to FIG. 9, assuming that data bits one through four are sourced from the same memory chip, respectively, data errors located by "symbol 1" can be localized to a particular memory chip (e.g., a DRAM).

Busses that are protected by ECC are typically run as single transfer busses with a SEC-DED code. In other words, any single bitlane failure is corrected by the SEC code because the ECC word is completely transmitted in one cycle (or shot or transfer). Thus, if a wire, contact, or bitlane is faulty, it would be a faulty bit in every transfer, and the SEC ECC will correct the error each cycle.

Defining symbols across bitlanes may be used to effectively isolate errors to memory chips when a relatively wide parallel ECC structure is implemented and a complete ECC word is transferred in a single cycle. However, defining symbols across bitlanes may not be effective in isolating errors to a particular memory chip or bus wire when a relatively narrow parallel interface is implemented with the ECC word (made up of data bits and ECC bits) being delivered in packets over multiple cycles.

BRIEF SUMMARY OF THE INVENTION

Exemplary embodiments of the present invention include a memory subsystem with a memory bus and a memory assembly. The memory bus includes multiple bitlanes. The memory assembly is in communication with the memory bus and includes instructions (circuitry and/or software) for receiving an error code correction (ECC) word in multiple packets via the memory bus. The ECC word includes data bits and ECC bits arranged into multiple multi-bit ECC symbols. Each of the ECC symbols is associated with one of the bitlanes on the memory bus. The memory assembly also includes instructions for utilizing one of the ECC symbols to perform error detection and correction for the bits in the ECC word received via the bitlane associated with the ECC symbol.

Additional exemplary embodiments include a memory subsystem with a memory bus and a memory assembly. The memory bus includes multiple bitlanes. The memory assembly is in communication with the memory bus and includes instructions (circuitry and/or software) for creating an ECC word. The ECC word includes data bits and ECC bits arranged into multiple multi-bit ECC symbols. Each of the ECC symbols is associated with one of the bitlanes on the memory bus. The memory assembly also includes instructions for transmitting the ECC word in multiple packets via the memory bus.

Further exemplary embodiments include a method for providing error detection and correction. The method includes receiving an ECC word at a memory assembly in multiple packets via a memory bus. The ECC word includes data bits and ECC bits arranged into multiple ECC symbols. Each of the ECC symbols is associated with one bitlane on the memory bus. The method further includes utilizing one of the ECC symbols to perform error detection and correction to bits in the ECC word received via the bitlane associated with the symbol.

Still further exemplary embodiments include a storage medium encoded with machine readable computer program code for providing fault detection and correction in a memory subsystem. The storage medium includes instructions for causing a computer to implement a method. The method includes receiving an ECC word at a memory assembly in multiple packets via a memory bus. The ECC word includes data bits and ECC bits arranged into multiple ECC symbols. Each of the ECC symbols is associated with one bitlane on the memory bus. The method further includes utilizing one of the ECC symbols to perform error detection and correction to bits in the ECC word received via the bitlane associated with the symbol.

An additional exemplary embodiment of the present invention includes a communication system with a bus containing multiple bitlanes and a device in communication with the bus. The device includes instructions for receiving an ECC word in multiple packets via the bus. The ECC word includes data bits and ECC bits arranged into multiple multi-bit ECC symbols with each of the ECC symbols being associated with one of the bitlanes on the bus. One of the ECC symbols is utilized to perform error detection and correction for the bits in the ECC word received via the bitlane and associated with the ECC symbol. The number of ECC bits is greater than a second number of ECC bits in a SEC/DED implementation of equivalent bitlane dimension. In addition, the number of bitlanes utilized to transfer the ECC bits is less than a second number of bitlanes in an SEC/DED implementation of equivalent bitlane dimension.

BRIEF DESCRIPTION OF THE DRAWINGS

Referring now to the drawings wherein like elements are numbered alike in the several FIGURES:

FIG. 13 depicts a downstream frame format that is utilized by exemplary embodiments of the present invention;

FIG. 14 depicts an upstream frame format that is utilized by exemplary embodiments of the present invention;

FIG. 15 is a table with symbols defined across bitlanes, using the upstream frame format depicted in FIG. 14 as an example; and FIG. 16 is a table with symbols defined within bitlanes, using the upstream frame format depicted in FIG. 14 as an example.

DETAILED DESCRIPTION OF THE PREFERRED EMBODIMENTS

Exemplary embodiments of the present invention utilize a symbol ECC interleaved such that the symbol orientation is along the bitlanes. A relatively narrow parallel interface is utilized with data that is delivered in packets over several transfers. Thus, the ECC word is two-dimensional in that the data bits and ECC bits are delivered in multiple cycles over a parallel interface. In order to provide protection for both random noise related soft errors on the bus, as well as systematic hard errors (errors such as a contact or wire failure along the bitlane), a new ECC scheme is employed. In addition, the capability of expanding the code to a higher order of robustness, for example going from a single symbol correcting code to a double symbol correcting code by using a spare wire(s), is available in this scheme. Exemplary embodiments of the present invention are contrasted against a detect/retry scheme where once an error is detected the data is re-sent. In exemplary embodiments of the present invention, errors are corrected on the fly, and in the event of a spare being deployed, the full ECC code is still available. Exemplary embodiments of the present invention provide an 88/72 ECC code that will detect all errors on a four bit symbol, correct all four bit symbol errors and detect all double four bit symbol errors (e.g., single 4-bit error correcting/double 4-bit error detecting (S4EC/D4ED).

SEC/DED=Single Error Correcting/Double Error Detecting

S4EC/D4ED=Single 4-bit Error Correcting/Double 4-bit Error Detecting

In an exemplary embodiment of the present invention, fault correction and detection is provided by a high speed and high reliability memory subsystem architecture and interconnect structure that includes single-ended point-to-point interconnections between any two subsystem components. The memory subsystem further includes a memory control function, one or more memory modules, one or more high speed busses operating at a four-to-one speed ratio relative to a DRAM data rate and a bus-to-bus converter chip on each of one or more cascaded modules to convert the high speed bus(ses) into the conventional double data rate (DDR) memory interface. The memory modules operate as slave devices to the memory controller, responding to commands in a deterministic manner, but do not self-initiate unplanned bus activity, except in cases where operational errors are reported in a real-time manner. Memory modules can be added to the cascaded bus with each module assigned an address to permit unique selection of each module on the cascaded bus. Exemplary embodiments of the present invention include a packetized multi-transfer interface which utilizes an innovative communication protocol to permit memory operation to occur on a reduced pincount, whereby address, command and data is transferred between the components on the cascaded bus over multiple cycles, and are reconstructed and errors corrected prior to being used by the intended recipient.

Figure 1:
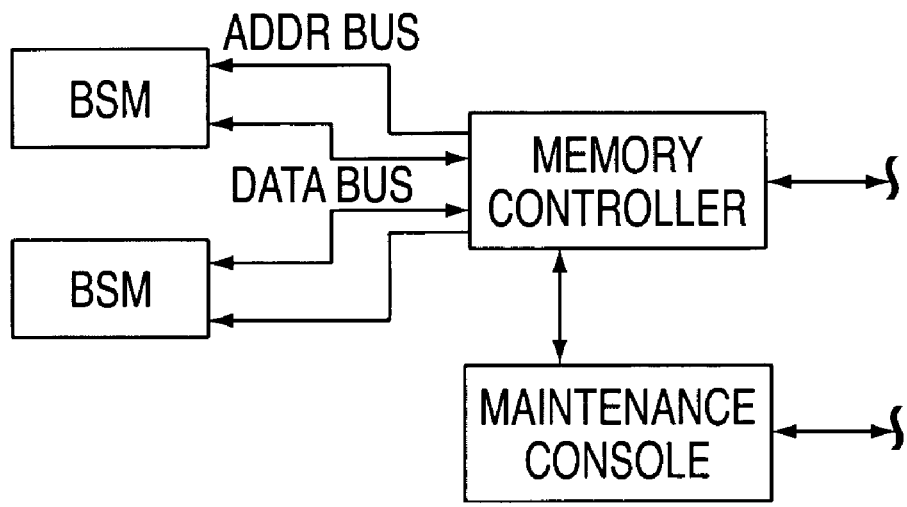
FIG. 1 depicts a prior art memory controller connected to two buffered memory assemblies via separate point-to-point links.
Figure 2:
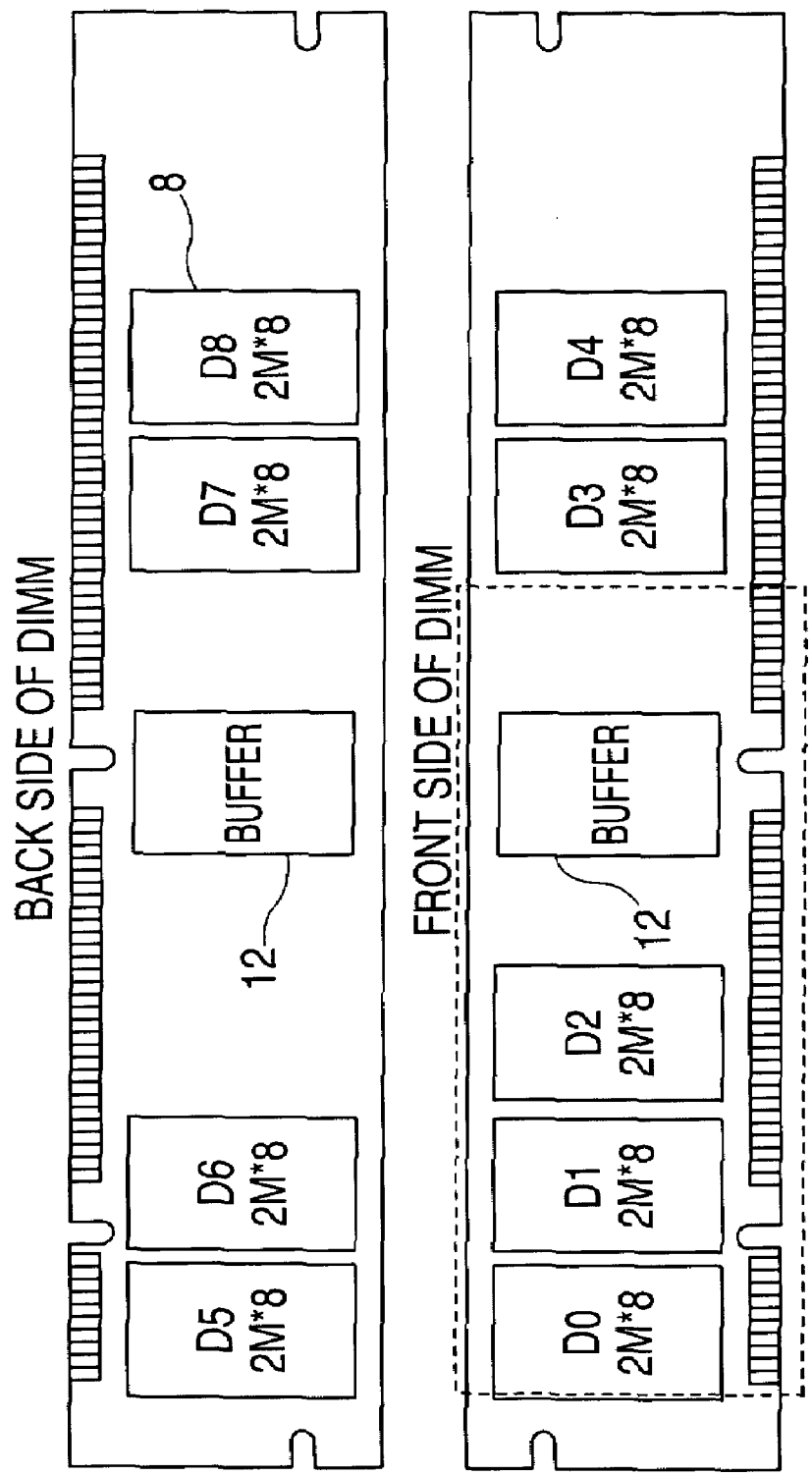
FIG. 2 depicts a prior art synchronous memory module with a buffer device.
Figure 3:
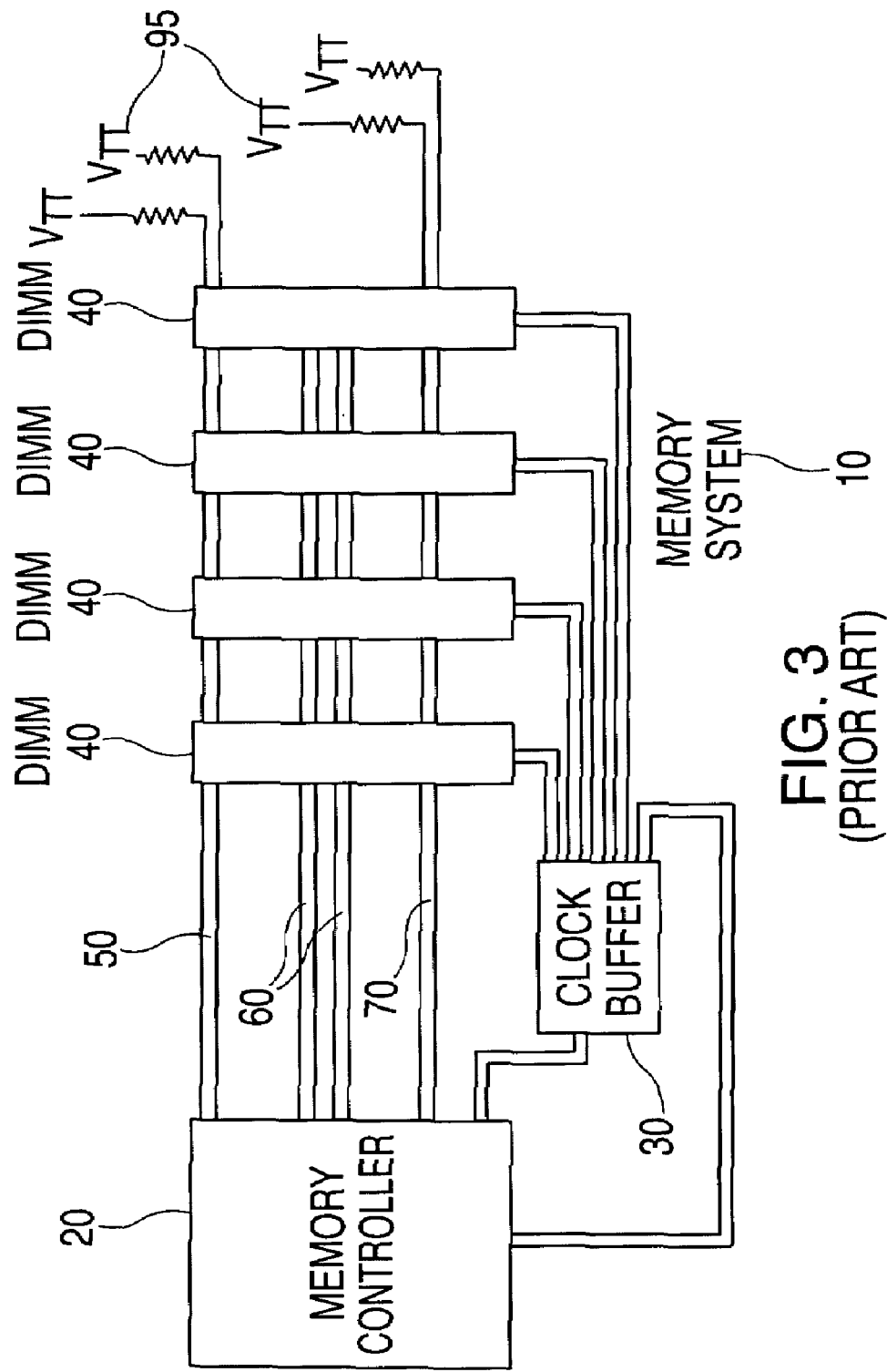
FIG. 3 depicts a prior art memory subsystem using registered DIMMs.
Figure 4:
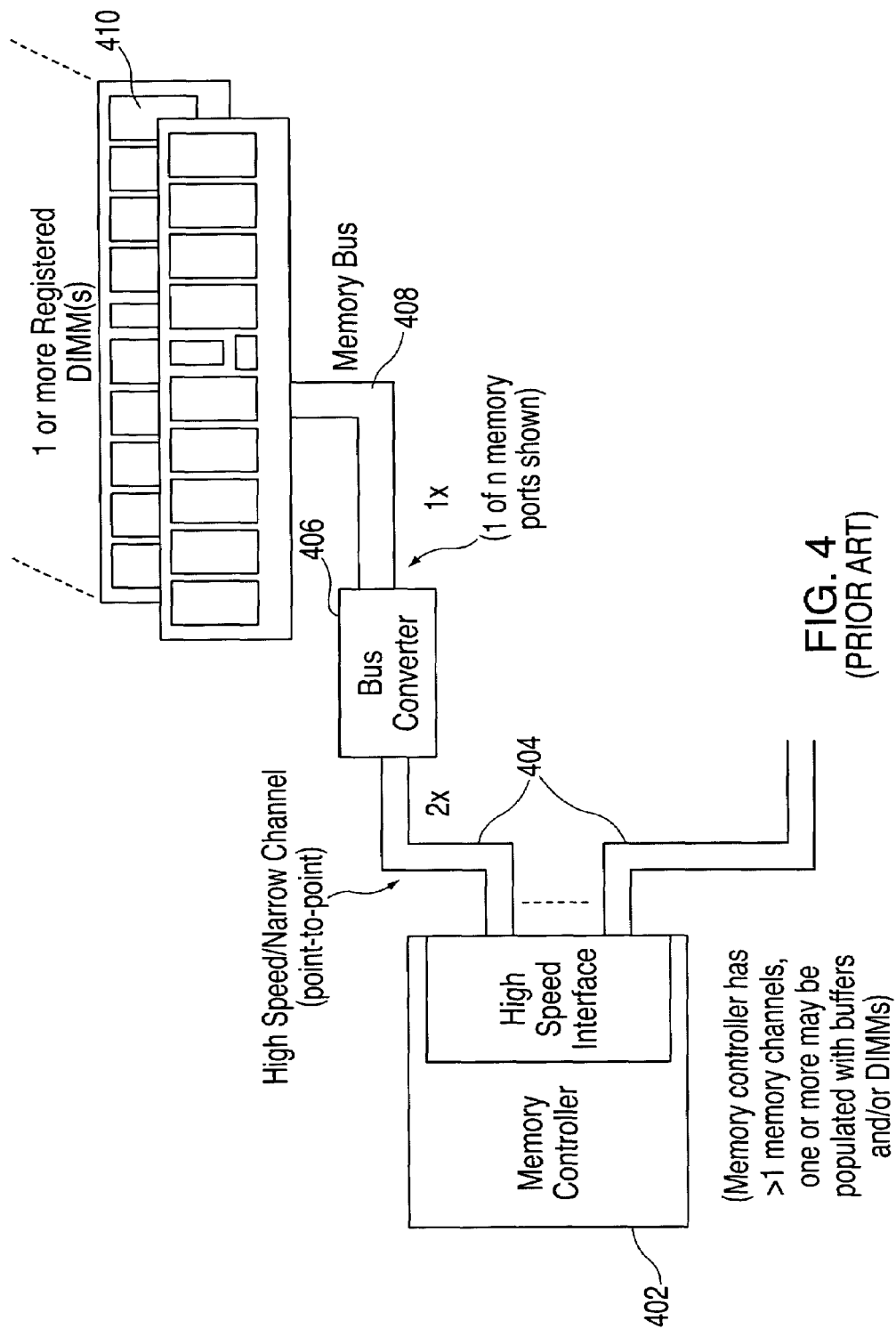
FIG. 4 depicts a prior art memory subsystem with point-to-point channels, registered DIMMs, and a 2:1 bus speed multiplier.
Figure 5:
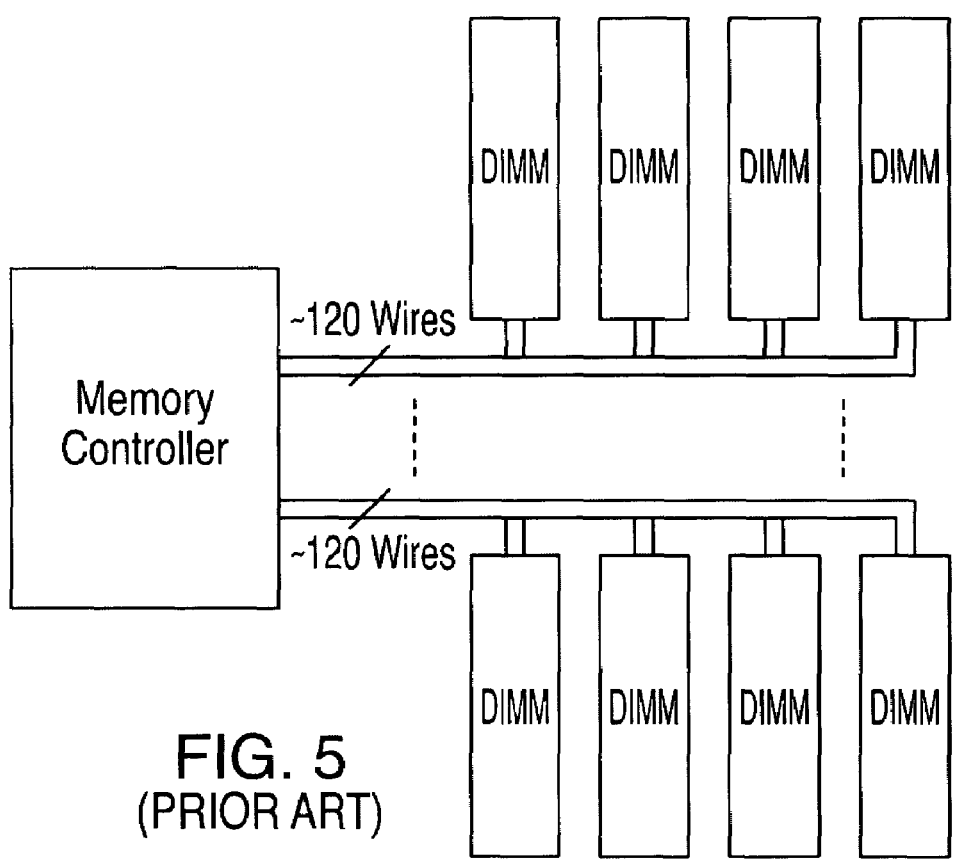
FIG. 5 depicts a prior art memory structure that utilizes a multidrop memory 'stub' bus.
Figure 6:
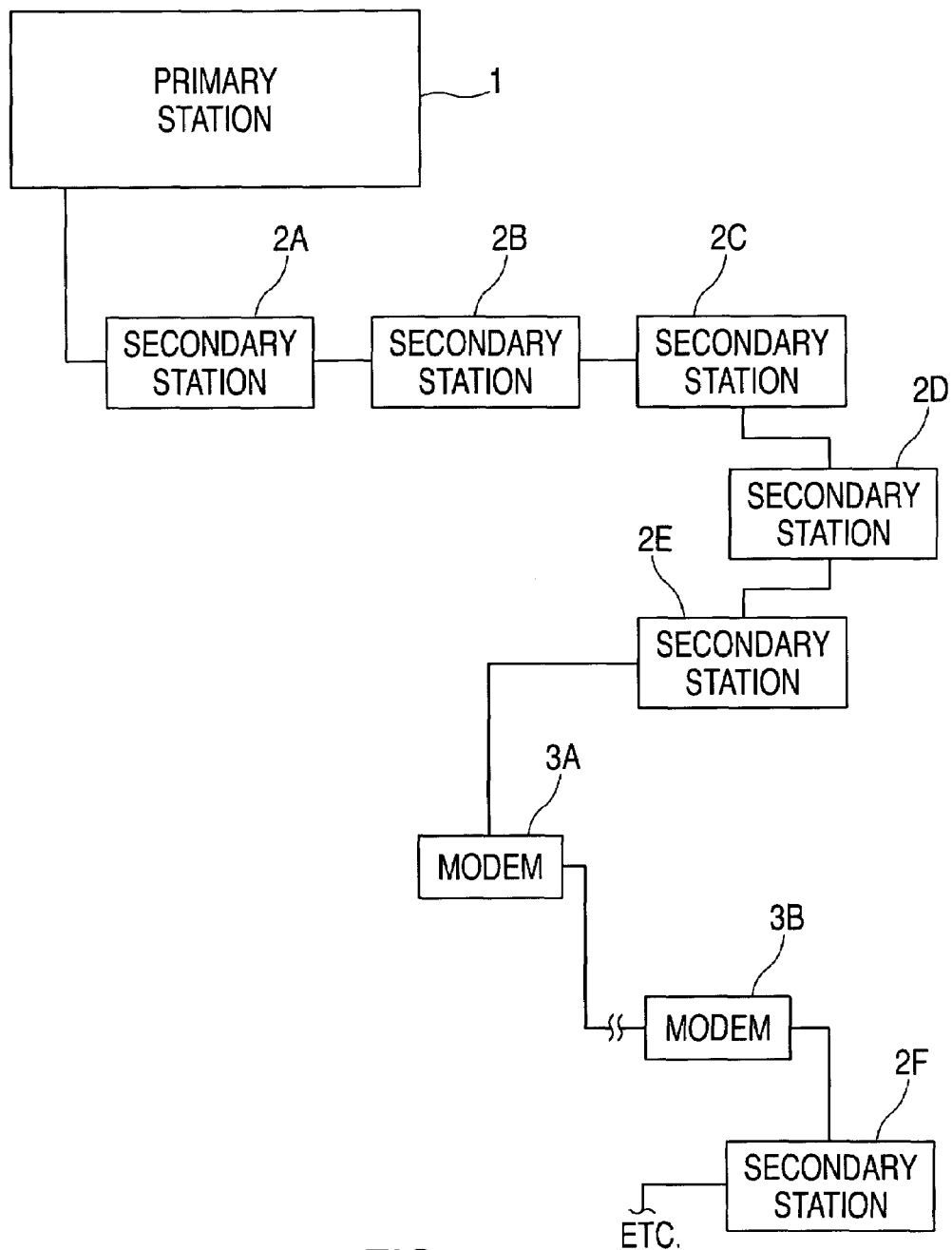
FIG. 6 depicts a prior art daisy chain structure in a multipoint communication structure that would otherwise require multiple ports.
Figure 7:
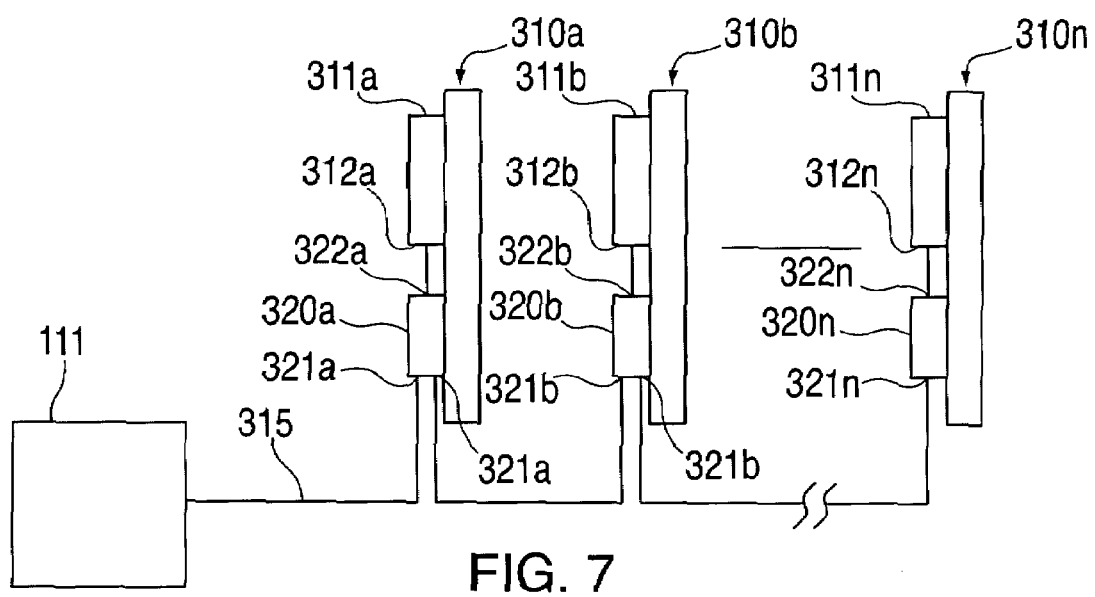
FIG. 7 depicts a prior art daisy chain connection between a memory controller and memory modules.
Figure 8:
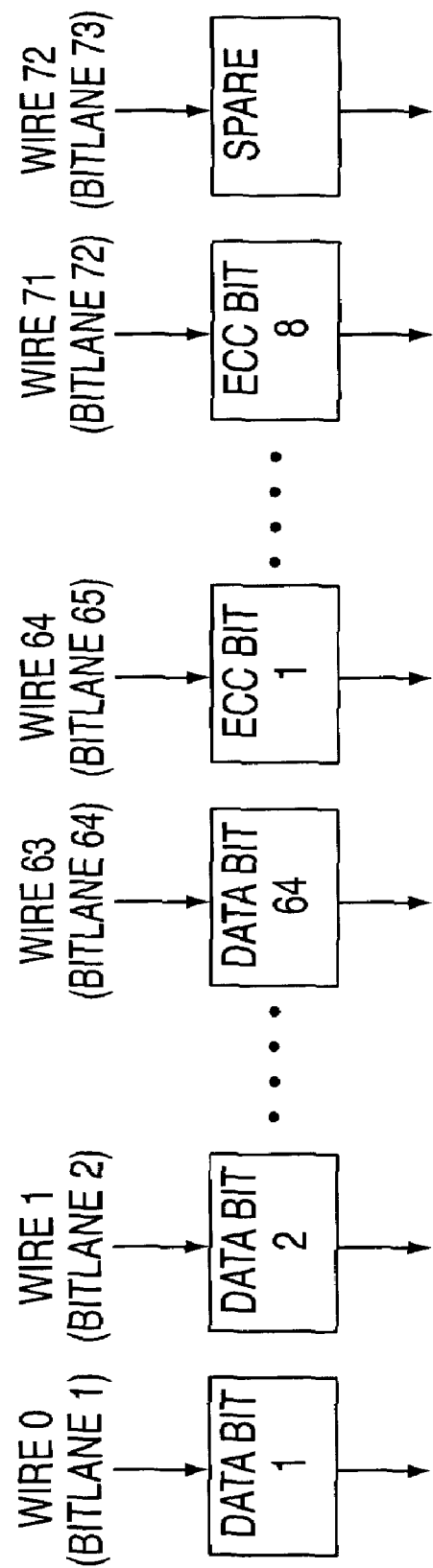
FIG. 8 represents a prior art parallel bus ECC structure that transfers a complete ECC word in a single cycle.
Figure 9:
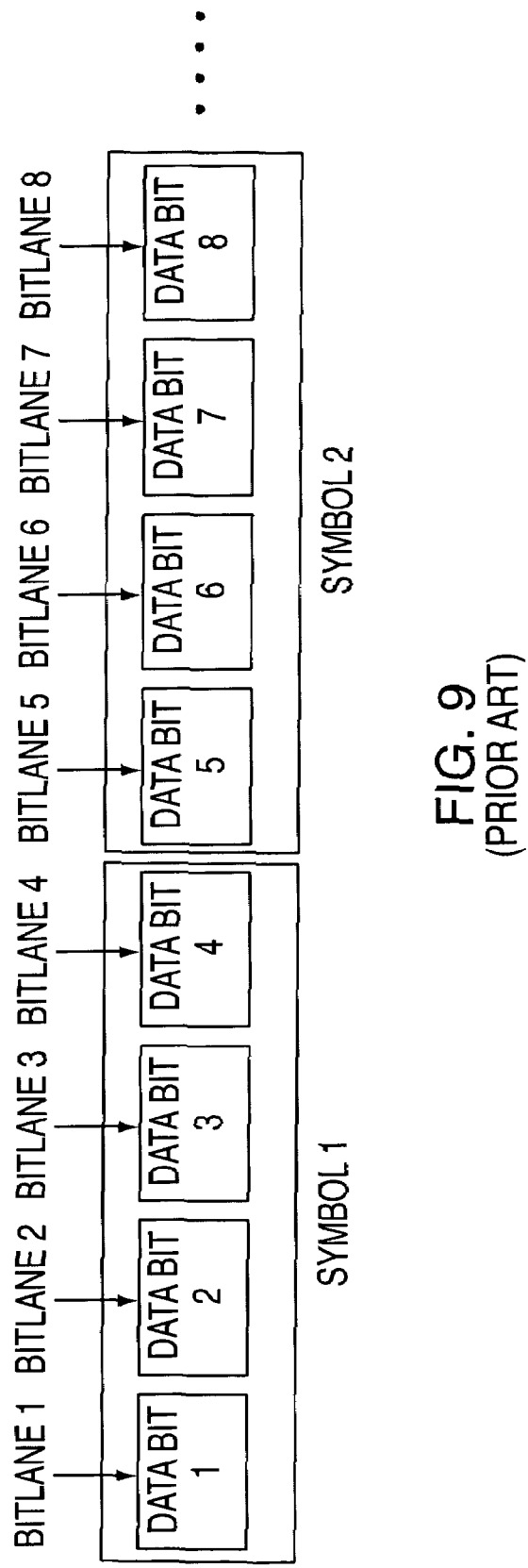
FIG. 9 depicts a prior art manner of defining symbol ECCs, for use in fault detection and correction in a memory subsystem.
Figure 10:
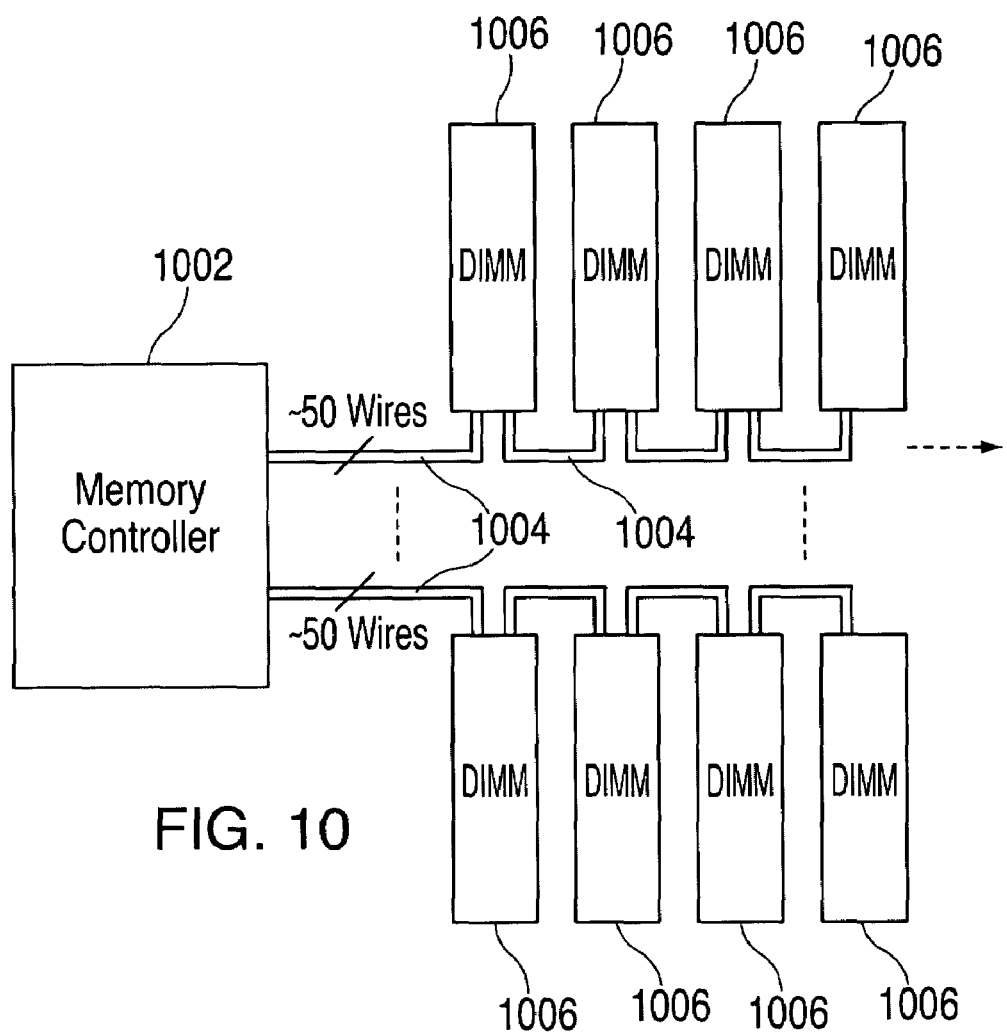
FIG. 10 depicts a cascaded memory structure that is utilized by exemplary embodiments of the present invention.

FIG. 10 depicts a cascaded memory structure that may be utilized by exemplary embodiments of the present invention when buffered memory modules 1006 (e.g., the buffer device is included within the memory module 1006) are in communication with a memory controller 1002. This memory structure includes the memory controller 1002 in communication with one or more memory modules 1006 via a high speed point-to-point bus 1004. Each bus 1004 in the exemplary embodiment depicted in FIG. 10 includes approximately fifty high speed wires for the transfer of address, command, data and clocks. By using point-to-point busses as described in the aforementioned prior art, it is possible to optimize the bus design to permit significantly increased data rates, as well as to reduce the bus pincount by transferring data over multiple cycles. Whereas FIG. 4 depicts a memory subsystem with a two to one ratio between the data rate on any one of the busses connecting the memory controller to one of the bus converters (e.g., to 1,066 Mb/s per pin) versus any one of the busses between the bus converter and one or more memory modules (e.g., to 533 Mb/s per pin), an exemplary embodiment of the present invention, as depicted in FIG. 10, provides a four to one bus speed ratio to maximize bus efficiency and minimize pincount.

Although point-to-point interconnects permit higher data rates, overall memory subsystem efficiency must be achieved by maintaining a reasonable number of memory modules 1006 and memory devices per channel (historically four memory modules with four to thirty-six chips per memory module, but as high as eight memory modules per channel and as few as one memory module per channel). Using a point-to-point bus necessitates a bus re-drive function on each memory module to permit memory modules to be cascaded such that each memory module is interconnected to other memory modules, as well as to the memory controller 1002.

Figure 11:
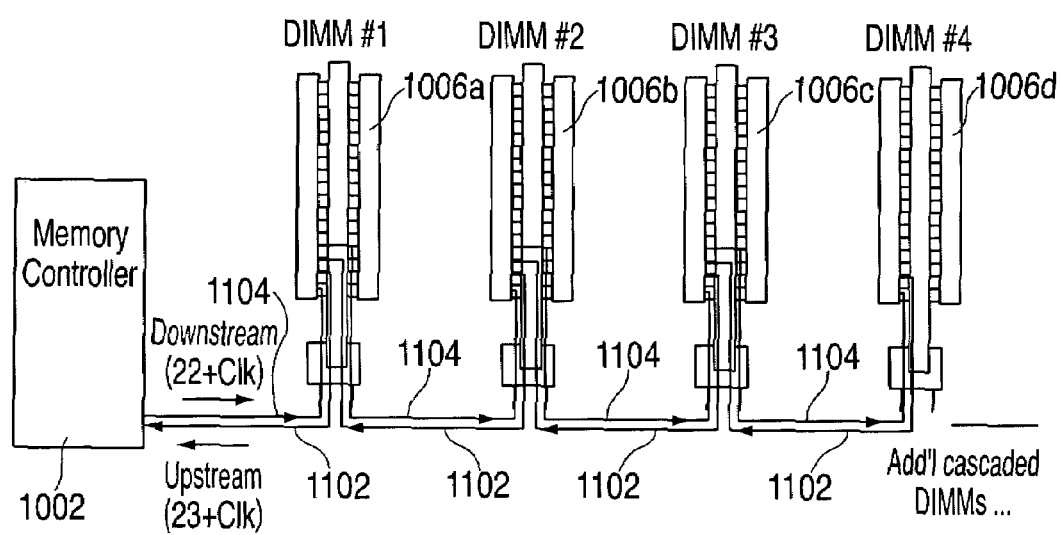
FIG. 11 depicts a memory structure with cascaded memory modules and unidirectional busses that is utilized by exemplary embodiments of the present invention.

FIG. 11 depicts a memory structure with cascaded memory modules and unidirectional busses that is utilized by exemplary embodiments of the present invention if all of the memory modules 1006 are buffered memory modules 1006. One of the functions provided by the memory modules 1006 in the cascade structure is a re-drive function to send signals on the memory bus to other memory modules 1006 or to the memory controller 1002. FIG. 11 includes the memory controller 1002 and four memory modules 1006a, 1006b, 1006c and 1006d, on each of two memory busses (a downstream memory bus 1104 and an upstream memory bus 1102), connected to the memory controller 1002 in either a direct or cascaded manner. Memory module 1006a is connected to the memory controller 1002 in a direct manner. Memory modules 1006b, 1006c and 1006d are connected to the memory controller 1002 in a cascaded manner.

An exemplary embodiment of the present invention includes two uni-directional busses between the memory controller 1002 and memory module 1006a ("DIMM #1"), as well as between each successive memory module 1006b-d ("DIMM #2", "DIMM #3" and "DIMM #4") in the cascaded memory structure. The downstream memory bus 1104 is comprised of twenty-two single-ended signals and a differential clock pair. The downstream memory bus 1104 is used to transfer address, control, data and error code correction (ECC) bits downstream from the memory controller 1002, over several clock cycles, to one or more of the memory modules 1006 installed on the cascaded memory channel. The upstream memory bus 1102 is comprised of twenty-three single-ended signals and a differential clock pair, and is used to transfer bus-level data and ECC bits upstream from the sourcing memory module 1006 to the memory controller 1002. Using this memory structure, and a four to one data rate multiplier between the DRAM data rate (e.g., 400 to 800 Mb/s per pin) and the unidirectional memory bus data rate (e.g., 1.6 to 3.2 Gb/s per pin), the memory controller 1002 signal pincount, per memory channel, is reduced from approximately one hundred and twenty pins to about fifty pins.

Figure 12:
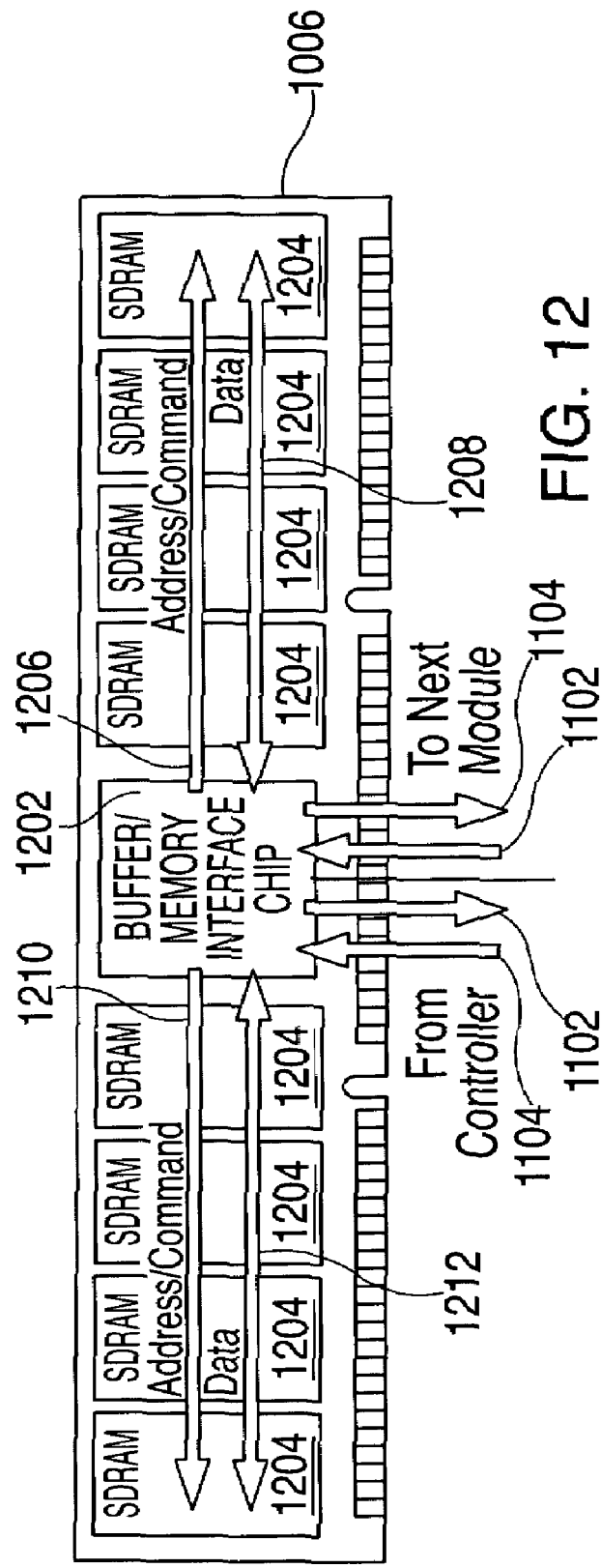
FIG. 12 depicts a buffered module wiring system that is utilized by exemplary embodiments of the present invention.

FIG. 12 depicts a buffered module wiring system that is utilized by exemplary embodiments of the present invention. FIG. 12 is a pictorial representation of a memory module with shaded arrows representing the primary signal flows. The signal flows include the upstream memory bus 1102, the downstream memory bus 1104, memory device address and command busses 1210 and 1206, and memory device data busses 1204 and 1208. In an exemplary embodiment of the present invention, a buffer device 1202, also referred to as a memory interface chip provides two copies of the address and command signals to the synchronous DRAMs (SDRAMs) 1204 with the right memory device address and command bus 1206 exiting from the right side of the buffer device 1202 for the SDRAMs 1204 located to the right side and behind the buffer device 1202 on the right. The left memory device address and command bus 1210 exits from the left side of the buffer device 1202 and connects to the SDRAMs 1204 to the left side and behind the buffer device 1202 on the left. Similarly, the data bits intended for SDRAMs 1204 to the right of the buffer device 1202 exit from the right of the buffer module 1202 on a right memory device data bus 1208. The data bits intended for the left side of the buffer device 1202 exit from the left of the buffer device 1202 on the left memory device data bus 1204. The high speed upstream memory bus 1102 and downstream memory bus 1104 exit from the lower portion of the buffer device 1202, and connect to a memory controller or other memory modules either upstream or downstream of this memory module 1006, depending on the application. The buffer device 1202 receives signals that are four times the memory module data rate and converts them into signals at the memory module data rate.

FIG. 13 depicts a downstream frame format that is utilized by exemplary embodiments of the present invention to transfer information downstream from the memory controller 1002 to the memory modules 1006. In an exemplary embodiment of the present invention, the downstream frame consists of eight transfers with each transfer including twenty-two signals and a differential clock (twenty-four wires total). The frame further consists of eight command wires (c0 through c7) 1308, nine data wires (di0 through di8) 1306, four bus error correction code (ECC) wires (ecc0 through ecc3) 1304 and a spare wire (spare) 1302. The seventy-two data bits are shown in FIG. 13 as bits di0 through di8, and consist of nine wires with eight transfers on each wire for each frame. In exemplary embodiments of the present invention, the frame format depicted in FIG. 13 may be utilized to deliver one or two memory commands plus seventy-two bits of write data per memory clock cycle. The numbering of each data bit, as well as for other bits, is based on the wire used, as well as the specific transfer. D34 refers to data bit 3 (of bits 0 through 8) and transfer 4 (of transfer 0 through 7). The command bit field is shown as c0 through c7, and consists of sixty-four bits of information provided to the module over eight transfers.

The ECC bit field (ecc0 through ecc3) consists of thirty-two bit positions over eight transfers but is actually formatted in groups of sixteen bits. Each sixteen bit packet consists of four transfers over each of the four wires and provides the bus level fault detection and correction across each group of four bus transfers. The bus level error correcting code fault detection and correction is performed by a logic block that includes instructions to carry out the detection and correction. The spare bit position may be used to logically replace any of the twenty-one wires, also defined as bitlanes, used to transfer bits in the command, data and ECC fields should a failure occur in one of the bitlanes that results in exceeding a system-assigned failure threshold limit. The spare wire may be utilized to replace a failing segment between any two directly connected assemblies (i.e., between the memory controller 1002 and the memory module 1006a, or between any two memory modules 1006a-d), to replace a wire due to events, such as a wire failure, a connector failure, a solder interconnect failure, a driver failure and/or a receiver failure. Out of the one hundred and seventy-six possible bit positions, one hundred and sixty-eight are available for the transfer of information to the memory module 1006, and of those one hundred and sixty-eight bit positions, thirty-two bit positions are further assigned to providing ECC protection on the bus transfers themselves, thereby allowing a total of one hundred and thirty-six bit positions to be used for the transfer of information to the memory module 1006. The frame format depicted in FIG. 13 is applicable to incoming signals to the memory module 1006 from the direction of the memory controller, as well as the outgoing signals to any downstream memory modules 1006.

FIG. 14 depicts an upstream frame format that is utilized by exemplary embodiments of the present invention to transfer information upstream from the memory module 1006 to either the memory controller 1002 or an upstream memory module 1006. In an exemplary embodiment of the present invention, the upstream frame consists of eight transfers with each transfer including twenty-three signals and a differential clock (twenty-five wires total). The frame further consists of eighteen data wires (do0 through do17) 1406, four bus ECC wires (ecc0 through ecc3) 1404 and a spare wire (spare) 1402. In exemplary embodiments of the present invention, the frame format depicted in FIG. 14 may be utilized to deliver one hundred and forty-four read data bits per memory clock cycle. The numbering of each data bit, as well as for other bits, is based on the wire used, as well as the specific transfer. D34 refers to data bit 3 (of bits 0 through 17) and transfer 4 (of transfer 0 through 7).

The ECC bit field (ecc0 through ecc3) consists of thirty-two bit positions over eight transfers but is actually formatted in groups of sixteen bits. Each sixteen bit packet consists of four transfers over each of the four wires with error correction being performed every four transfers. The spare wire position may be used to logically replace any of the twenty-two wires used to transfer bits in the data and ECC fields should a failure occur in one of these wires that is consistent in nature. A failure may be considered to be consistent in nature if it exceeds a system dependent threshold value (e.g., number of times the failure is detected). Single bitlane failures may be corrected on the fly by the bus level ECC, while a system service element, such as a service processor, may decide to spare out a failing segment to repair hard (e.g., periodic, repeating and continuous) failures that may occur during system operation.

FIG. 15 is a table with symbols defined across bitlanes, using the upstream frame format depicted in FIG. 14 as an example. Each column 1506 represents the bits of a symbol (i.e., "bit 1", "bit 2", "bit 3", and "bit 4"). Each row represents a symbol (i.e., "symbol 1", "symbol 2", etc.). Bit 1 of symbol 1 contains data bit D00 from FIG. 14, bit 2 of symbol 1 contains data bit D10 from FIG. 14, bit 3 contains data bit D20 from FIG. 14 and bit 4 contains data bit D30 from FIG. 14. All of the data bits contained in symbol 1 are transferred during the first transfer within the frame, or transfer 0. As described previously, the ECC is checked for every four transfers in a frame, or for every half frame. The ECC word, including eighty-eight bits (the spare bitlane is included in place of a failing bitlane only if it is being utilized), is transferred over multiple cycles (e.g., four) such that a hard fail in any bitlane or wire will result in a multiple-bit error. A typical single symbol correcting/double symbol detecting (SSC/DSD) ECC scheme will not be effective in correcting hard bitlane failures for the symbol scheme depicted in FIG. 15 because the bits within the symbol are not being sent on the same bitlane. Also, a SSC/DSD code would not be effective either because symbols are generally distributed among adjacent bits of a bus. This approach to forming symbols across bitlanes, as applied to the upstream format shown in FIG. 14, is shown in FIG. 15.

FIG. 16 is a table with symbols defined along the bitlanes, in accordance with exemplary embodiments of the present invention, using the upstream frame format depicted in FIG. 14 as an example. The first four columns 1604 in FIG. 16 represent the bits of a symbol (i.e., "bit 1", "bit 2", "bit 3", and "bit 4"). The last column 1606 contains the bitlane being covered by the symbol. Each row represents a symbol (i.e., "symbol 1", "symbol 2", etc.). Bit 1 of symbol 1 contains data bit D00 from FIG. 14, bit 2 of symbol 1 contains data bit D01 from FIG. 14, bit 3 contains data bit D02 from FIG. 14 and bit 4 contains data bit D03 from FIG. 14. Symbol 1 covers bitlane 5 in FIG. 14. Bit 1 was transferred during transfer zero, bit 2 during transfer one, bit 3 during transfer two and bit 4 during transfer three. Interleaving the data bits in the ECC code such that the ECC symbol is defined along the bitlanes allows the data bits to be protected along the bitlane dimension rather than in the databit dimension depicted in FIG. 15. Again, the ECC is checked every four transfers in a frame, or for every half frame. The ECC word, including eighty-eight bits (the spare bitlane is included in place of a failing bitlane only if it is being utilized), is transferred over multiple cycles (e.g., four). The ECC word includes both data bits and ECC bits. Data bits may include, but are not limited to, command bits, write data bits and read data bits. In addition, ECC bits may be treated as data bits with the ECC processing described herein being applied to the ECC bits.

The symbols in FIG. 16 are defined to span a single bitlane, and if any of the hardware that is associated with any of the bitlanes fails, the failure will affect all four of the data bits that are transferred via the failing bitlane. Orienting the symbol along the bitlanes allows a single and/or multiple errors caused by a failing bitlane to be detected and corrected.

A further advantage of defining symbols along bitlanes is that it uncouples the requirement to have unique data/address/command format with the ECC word. Exemplary embodiments of the present invention allow data bits one through seventy-two to be any combination of data, address or command information.

Another benefit to defining symbols along bitlanes is that it is flexible and modular in that an additional bitlane can be added to the bus for the purposes of additional data, additional robustness, or even as a spare. Because the additional bitlane is dedicated to the added function, no further structural changes are required to allow the benefits of the added wire to accrue (either in more data capacity, spare capability, or a more robust ECC).

In addition, the scheme of defining symbols along bitlanes can be expanded to include an arbitrary number of transfers. This will cause the ECC symbol size to commensurately grow, but conceptually and structurally, this idea can be extended in the transfer dimension without any loss of coverage.

In general, the narrower the bus, the greater percentage of signals that must be checkbits to provide the same level of protection. For classic Hamming codes, or traditional SEC/DED bus ECC, the following table illustrates this point:

| Maximum Data Signals | Checkbit Signals | Percent Overhead |
| --- | --- | --- |
| 4 | 4 | 50% |
| 11 | 5 | 31% |
| 26 | 6 | 19% |
| 57 | 7 | 11% |
| 120 | 8 | 6% |
| 247 | 9 | 4% |

This can be compared to exemplary embodiments of the present invention including symbol oriented bus ECC where 4 checkbits are utilized for up to 253 data signals with a resulting overhead of 1.6%. Therefore, six checkbits could have been utilized to support 17 or 18 databits if the traditional SEC/DED had been utilized.

One drawback to using the traditional SEC/DED for read and write data busses that are daisy-chained through the support ASIC is that each additional checkbit gets multiplied by four in terms of ASIC pincount (i.e., 2 additional checkbits for each bus equals 8 additional ASIC pins). Another drawback to using the traditional SEC/DED is that the probability that a code will detect random, multibit errors is inversely proportional to the expression "2 raised to the nth power", where n is the number of checkbits. This means that a (24,18) SEC/DED code with 6 checkbits has a figure of merit of $1/(2^6)=0.016$. This is contrasted to exemplary embodiments of the present invention described herein that have a figure of merit of $1/(2^{16})=0.000015$, which is about 100 times better. A further advantage of exemplary embodiments of the present invention over the traditional SEC/DED approach is that the current design point described herein of 18 data bitlanes can be expanded to support up to 253 bitlanes without adding new checkbits. In contrast, the traditional SEC/DED approach would require the addition of checkbits such that even adding 9 additional data bitlanes (for a total of 27) would require an additional checkbit.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A memory subsystem, the memory subsystem comprising:
   a memory bus comprising multiple bitlanes; and
   a memory assembly in communication with the memory bus, the memory assembly including instructions for:
   receiving an error code correction (ECC) word in multiple packets via the memory bus, the ECC word including data bits and ECC bits arranged into multiple multi-bit ECC symbols, wherein each of the ECC symbols is associated with one of the bitlanes on the memory bus;
   utilizing one of the ECC symbols to perform error detection and correction for the bits in the ECC word received via the bitlane associated with the ECC symbol;
   creating a new ECC word; and
   transmitting the new ECC word.

2. The memory subsystem of claim 1 wherein the memory bus comprises twenty-two bitlanes.

3. The memory subsystem of claim 2 wherein eighteen of the twenty-two bitlanes contain the data bits and four of the twenty-two bitlanes contain the ECC bits.

4. The memory subsystem of claim 2 wherein the memory bus further comprises a spare bitlane.

5. The memory subsystem of claim 1 wherein the receiving an ECC word requires four packets to be transferred via the memory bus.

6. The memory subsystem of claim 1 wherein the symbol includes four bits.

7. The memory subsystem of claim 1 wherein the memory bus and the memory assembly are part of a cascaded interconnect memory system.

8. The memory subsystem of claim 1 wherein the memory assembly is a memory controller or a memory module.

9. The memory subsystem of claim 1 wherein the memory bus is a downstream bus.

10. The memory subsystem of claim 1 wherein the memory bus is an upstream bus.

11. The memory subsystem of claim 1 wherein the ECC bits are also data bits.

12. A communication system comprising:
    a bus comprising multiple bitlanes; and
    a device in communication with the bus, the device including instructions for:
    receiving an error code correction (ECC) word in multiple packets via the bus, the ECC word including data bits and ECC bits arranged into multiple multi-bit ECC symbols, wherein each of the ECC symbols is associated with one of the bitlanes on the bus; and
    utilizing one of the ECC symbols to perform error detection and correction for the bits in the ECC word received via the bitlane and associated with the ECC symbol, wherein the number of ECC bits is greater than a second number of ECC bits in a single error correcting/double error detecting (SEC/DED) implementation of equivalent bitlane dimension and the number of said bitlanes utilized to transfer the ECC bits is less than a second number of bitlanes in an SEC/DED implementation of equivalent bitlane dimension.

13. The system of claim 12 wherein the communication system is a memory subsystem, the bus is a memory bus and the device is a memory device.

14. The system of claim 12 wherein the number of said bitlanes is between 16 and 254 and the number of ECC bits per packet is four.

* * * * *